(12) United States Patent
Guo et al.

(10) Patent No.: US 10,013,913 B2
(45) Date of Patent: Jul. 3, 2018

(54) PIXEL STRUCTURE, DISPLAY SUBSTRATE AND DISPLAY DEVICE

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Renwei Guo, Beijing (CN); Xue Dong, China (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 15/036,711

(22) PCT Filed: Dec. 9, 2015

(86) PCT No.: PCT/CN2015/096815
§ 371 (c)(1),
(2) Date: May 13, 2016

(87) PCT Pub. No.: WO2016/161814
PCT Pub. Date: Oct. 13, 2016

(65) Prior Publication Data
US 2017/0132969 A1    May 11, 2017

(30) Foreign Application Priority Data

Apr. 8, 2015  (CN) .......................... 2015 1 0164084

(51) Int. Cl.
*G09G 3/36*    (2006.01)
*G09G 5/02*    (2006.01)
(Continued)

(52) U.S. Cl.
CPC ......... *G09G 3/3208* (2013.01); *G09G 3/2003* (2013.01); *H01L 27/3218* (2013.01);
(Continued)

(58) Field of Classification Search
CPC .......... G09G 2300/0452; G09G 3/2003; G06T 2207/10024
See application file for complete search history.

(56) References Cited

U.S. PATENT DOCUMENTS 7,042,537 B2 *   5/2006   Kanazawa ........ G02F 1/133514
                                              349/106
2006/0290870 A1 * 12/2006  Kwak ............... G02F 1/133514
                                              349/144

(Continued)

FOREIGN PATENT DOCUMENTS

CN          1725274        1/2006
CN        102354476        2/2012

(Continued)

OTHER PUBLICATIONS

International Search Report from corresponding PCT Application No. PCT/CN2015/096815 (5 pages).

(Continued)

*Primary Examiner* — Nan-Ying Yang
(74) *Attorney, Agent, or Firm* — Harness, Dickey & Pierce, P.L.C.

(57) ABSTRACT

A pixel structure comprises a plurality of first pixels, inverted first pixels, second pixels, inverted second pixels, third pixels and inverted third pixels, wherein in a first line of pixels, the first pixel, second pixel and third pixel are arranged horizontally in a circular manner, and in a second line of pixels, the inverted first pixel, inverted second pixel and inverted third pixel are arranged horizontally in a circular manner, wherein the first pixel comprises a first (Continued)

subpixel and an inverted second subpixel, the second pixel comprises a third subpixel and an inverted first subpixel, the third pixel comprises a second subpixel and an inverted third subpixel, the first subpixel, second subpixel, and third subpixel are different from each other, and are selected from red, green, and blue subpixels, respectively, wherein the red, green and blue subpixels are in the shape of a congruent isosceles triangle.

13 Claims, 9 Drawing Sheets

(51) Int. Cl.
    *G09G 5/00*         (2006.01)
    *G09G 5/10*         (2006.01)
    *G09G 3/3208*       (2016.01)
    *H01L 27/32*       (2006.01)
    *G09G 3/20*        (2006.01)

(52) U.S. Cl.
    CPC .............. *G09G 2300/0452* (2013.01); *G09G 2300/0465* (2013.01)

(56) References Cited

U.S. PATENT DOCUMENTS

2009/0102768 A1*   4/2009   Shimizu ................ H04N 9/045
                                                                       345/88
2010/0118045 A1*   5/2010   Brown Elliott .... G02B 27/2214
                                                                    345/589
2013/0286262 A1* 10/2013   Hayashi ................ H04N 9/045
                                                                    348/280
2017/0132969 A1    5/2017   Guo

FOREIGN PATENT DOCUMENTS

CN           104795427        7/2015
KR        20050052265      6/2005

OTHER PUBLICATIONS

Written Opinion of the International Searching Authority from corresponding PCT Application No. PCT/CN2015/096815 (4 pages).

Office action from corresponding Chinese Application No. 201510164084.7 (5 pages).

* cited by examiner

PIXEL STRUCTURE, DISPLAY SUBSTRATE AND DISPLAY DEVICE

CROSS-REFERENCES TO RELATED APPLICATIONS

The present application claims priority of Chinese Patent Application No. 201510164084.7, which was filed on Apr. 8, 2015, the entire content of which is incorporated by reference herein.

FIELD OF THE INVENTION

Exemplary embodiments of the present invention relate to a pixel structure, a display substrate and a display device.

BACKGROUND

Figure 1:
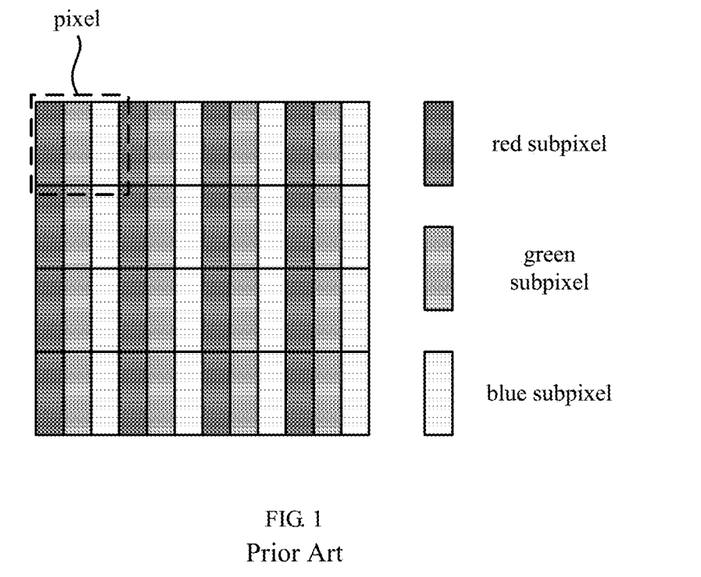
FIG. 1 shows a schematic view of a pixel structure in the prior art.

In a conventional display substrate, the pixel structure employs RGB (Red, Green and Blue) subpixels arranged in a circular manner, each pixel having the same area and consisting of horizontally arranged red, green, and blue subpixels, each subpixel having the same area and the specific structure as shown in FIG. 1. When a display substrate employing this pixel structure displays an image, visual resolution and physical resolution are the same.

With the increasing demand for visual resolution in the market, in the production of subpixels of OLED (Organic Light Emitting Diode), since it is difficult to form patterns of organic light emitting materials in process steps, if a traditional way of arrangement is used to form subpixels, it is required to closely arrange organic light emitting materials. In the production of an OLED display substrate with higher visual resolution, small and high-density integration is required for production of each light-emitting material, thereby resulting in difficult processes and high cost.

BRIEF SUMMARY OF THE DISCLOSURE

A pixel structure, a display substrate and a display device provided according to an exemplary embodiment of the present invention are capable of using a small number of actual physical pixel spatial positions to represent more image signals, thereby improving the actual output image quality.

According to a first aspect of the present invention, there is proposed a pixel structure, comprising: a plurality of first pixels and inverted first pixels, a plurality of second pixels and inverted second pixels, a plurality of third pixels and inverted third pixels, wherein in a first line of pixels of two adjacent lines of pixels, the first pixel, the second pixel and the third pixel are arranged horizontally in a circular manner, and in a second line of pixels, the inverted first pixel, the inverted second pixel and the inverted third pixel are arranged horizontally in a circular manner, wherein the first pixel comprises a first subpixel and an inverted second subpixel, wherein the second pixel comprises a third subpixel and an inverted first subpixel, wherein the third pixel comprises a second subpixel and an inverted third subpixel, and wherein the first subpixel, the second subpixel, and the third subpixel are different from each other, and are selected from red subpixels, green subpixels, and blue subpixels, respectively, wherein the red subpixels, the green subpixels and the blue subpixels are in the shape of a congruent isosceles triangle.

According to an embodiment of the present invention, the first subpixel in the first pixel has the same y-ordinate as the inverted first subpixel in the inverted first pixel;

wherein the inverted second subpixel in the first pixel has the same y-ordinate as the second subpixel in the inverted first pixel, wherein the third subpixel in the second pixel has the same y-ordinate as the inverted third subpixel in the inverted second pixel, wherein the inverted first subpixel in the second pixel has the same y-ordinate as the first subpixel in the inverted second pixel, wherein the second subpixel in the third pixel has the same y-ordinate as the inverted second subpixel in the inverted third pixel, and wherein the inverted third subpixel in the third pixel has the same y-ordinate as the third subpixel in the inverted third pixel.

The pixel structure according to an exemplary embodiment of the present invention further comprises:

a plurality of sampling regions, wherein a center of each of the sampling regions coincides with the coordinate point of the first subpixel, or the second subpixel or the third subpixel.

According to an exemplary embodiment of the present invention, the sampling region is a rectangle in shape, the width of the rectangle is equal to the height of the first subpixel, and the length of the rectangle is equal to 1.5 times the length of the base of the first subpixel.

According to an exemplary embodiment of the present invention, the isosceles triangle is an equilateral triangle.

The pixel structure according to an exemplary embodiment of the present invention further comprises:

a drive unit, which is configured to determine, upon receiving a white point display command, the coordinates of the white point to be displayed, and to drive the first subpixel, second subpixel and third subpixel with the determined coordinates as vertices, or to drive the inverted first subpixel, inverted second subpixel and inverted third subpixel with the determined coordinates as vertices.

According to an exemplary embodiment of the present invention, upon receiving a monochrome vertical line display command, the drive unit drives target color subpixels and/or inverted target color subpixels with a target y-ordinate.

According to an exemplary embodiment of the present invention, upon receiving a slash display command, the drive unit determines coordinates of two starting subpixels of the slash to be displayed are $(R_m, A_n)$, $(R_m, A_{n+1})$ and coordinates of two end subpixels of the slash are $(R_{m+k}, A_{n+k})$, $(R_{m+k}, A_{n+k+1})$, and drives subpixels with one or more colors and coordinates $(R_{m+x}, A_{n+x})$, $(R_{m+x}, A_{n+x+1})$, wherein x is an integer greater than or equal to 0 and less than or equal to k, and m, n and k are positive integers.

According to an exemplary embodiment of the present invention, upon receiving a display command, the drive unit determines an area to be displayed and subpixels to be displayed, allocates the luminance of a % to the subpixels to be displayed in the area to be displayed, and allocates the luminance of 0.5a % to subpixels having the same color as the subpixels to be displayed in an area adjacent to the area to be displayed, where a is a positive number.

According to an exemplary embodiment of the present invention, materials of the first subpixel, second subpixel and third subpixel include organic light emitting material.

According to an exemplary embodiment of the present invention, wherein the first subpixels are red subpixels, the second subpixels are green subpixels, and the third subpixels are blue subpixels.

According to another aspect of the present invention, there is provided a display substrate comprising the pixel structure.

According to yet another aspect of the present invention, there is provided a display device comprising the display substrate.

According to an exemplary embodiment of the present invention, a pixel may be formed by two subpixels with a shape of an isosceles triangle, the subpixels are driven by subpixel rendering, and a small number of actual physical pixel spatial positions are used to represent more image signals, thereby improving the actual output image quality.

BRIEF DESCRIPTION OF THE DRAWINGS

To make the technical solution of the embodiments of the present invention or of the prior art clearer, the accompanying drawings for illustrating the embodiments of the present invention or the prior art are outlined below. Evidently, the accompanying drawings are exemplary only, and those skilled in the art can derive other drawings from such accompanying drawings without creative efforts.

DETAILED DESCRIPTION

The technical solution in embodiments of the present invention will be clearly and completely described below in combination with drawings in the embodiments of the present invention. Apparently, the embodiments described are only part instead of all of the embodiments of the present invention. Base on the embodiments of the present invention, all other embodiments obtained by those of ordinary skill in the art without creative efforts fall within the scope of protection of the present disclosure.

In the description of the present invention, it should be noted that the orientation or position relationship indicated by terms "upper", "lower", "top", "bottom" and the like is an orientation or position relationship shown based on the drawings, and is only intended for facilitating in describing the present disclosure and simplifying the description, rather than indicating or implying that the referred devices or elements must have a specific orientation, and be constructed in a specific orientation and operation and therefore cannot be construed as limiting the present disclosure.

Further, in the present invention, terms "first", "second", "third" are for the purpose of description only, and cannot be construed as indicating or implying relative importance. The term "plurality" refers to two or more, unless otherwise expressly defined.

Figure 2:
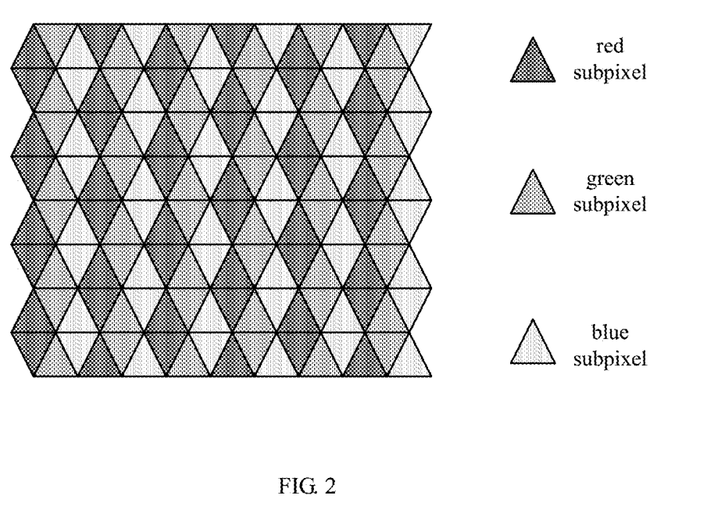
FIG. 2 shows a schematic view of a pixel structure according to an embodiment of the present invention.

As shown in FIG. 2, a pixel structure according to one embodiment of the present invention, comprises: a plurality of first pixels and inverted first pixels, a plurality of second pixels and inverted second pixels, a plurality of third pixels and inverted third pixels.

In the first line of pixels of two adjacent lines of pixels, the first pixel, the second pixel and the third pixel are arranged horizontally in a circular manner, and in the second line of pixels, the inverted first pixel, the inverted second pixel and the inverted third pixel are arranged horizontally in a circular manner. Alternatively, in the first line of pixels of two adjacent lines of pixels, the inverted first pixel, the inverted second pixel and the inverted third pixel are arranged horizontally in a circular manner, and in the second line of pixels, the first pixel, the second pixel and the third pixel are arranged horizontally in a circular manner. It should be noted that the inverted pixels abovementioned may be obtained by rotating corresponding pixels by 180° around their centers, and similarly, the inverted subpixels may also be obtained by rotating corresponding subpixels by 180° around their centers. For example, the inverted first pixel may be obtained by rotating the first pixel by 180° around its center, and the inverted first subpixel may be obtained by rotating the first subpixel by 180° around its center.

Figure 3:
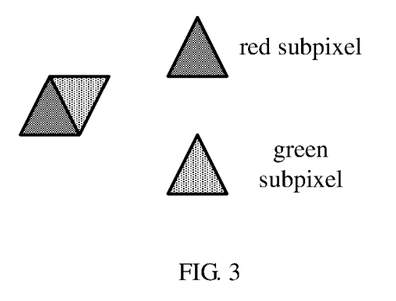
FIG. 3 shows a structural schematic view of a first pixel according to an embodiment of the present invention.
Figure 4:
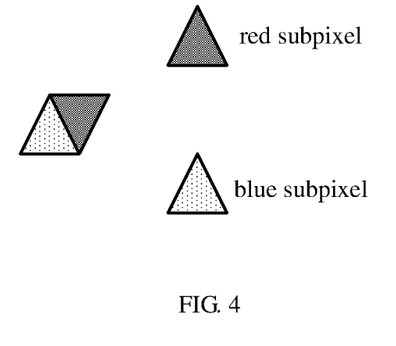
FIG. 4 shows a structural schematic view of a second pixel according to an embodiment of the present invention.
Figure 5:
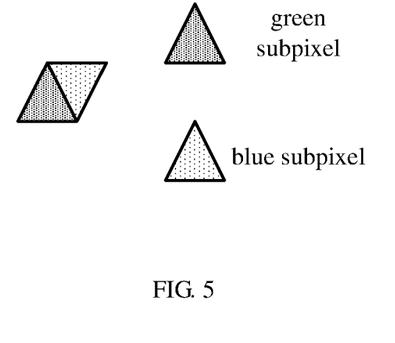
FIG. 5 shows a structural schematic view of a third pixel according to an embodiment of the present invention.

In one exemplary embodiment, as shown in FIG. 3, a first pixel includes a red subpixel and an inverted green subpixel; as shown in FIG. 4, a second pixel includes a blue subpixel and an inverted red subpixel; as shown in FIG. 5, a third pixel includes a green subpixel and an inverted blue subpixel, the red subpixel, green subpixel and blue subpixel being in the shape of a congruent isosceles triangle. It should be noted that this exemplary embodiment only gives a specific structure of the first pixel, second pixel and third pixel. As long as adjacent subpixels are different to each other when the first pixel, the second pixel and the third pixel are arranged horizontally in a circular manner, the first pixel, the second pixel and the third pixel may also employ other similar structures.

When driving the red subpixel, the green subpixel and/or the blue subpixel by Subpixel Rendering (SPR) (also including inverted red subpixel, inverted green subpixel and/or inverted blue subpixel, if not described otherwise, when the following relevant settings relating to the red subpixel, the green subpixel and the blue subpixel are also applied to the corresponding inverted subpixels and will not be repeated hereinafter), since in the first line of pixels of two adjacent lines of pixels, the first pixel, the second pixel and the third pixel are arranged horizontally in a circular manner, and in a second line of pixels, the inverted first pixel, the inverted second pixel and the inverted third pixel are arranged horizontally in a circular manner, so that when any pixel in the pixel structure makes use of subpixels in adjacent pixels, it certainly can make use of subpixels with its missing color.

For example, in FIG. 2, the second pixel (including the blue subpixels and the inverted red subpixels) is adjacent to the inverted green subpixels in the first pixel, and is adjacent to the green subpixels in the third pixel. In despite of making use of subpixels either from the first pixel or from the third pixel, the second pixel may make use of the green subpixel, thereby achieving complete color display. According to an exemplary embodiment of the present invention, by driving the pixel structure with subpixel rendering, the visual resolution of the display substrate including the pixel structure may be caused to be greater than the physical resolution, and with respect to a pixel structure used in the prior art in FIG. 1, a small number of actual physical pixel spatial positions may be used to represent more image signals, thereby improving the actual output image quality.

Figure 6:
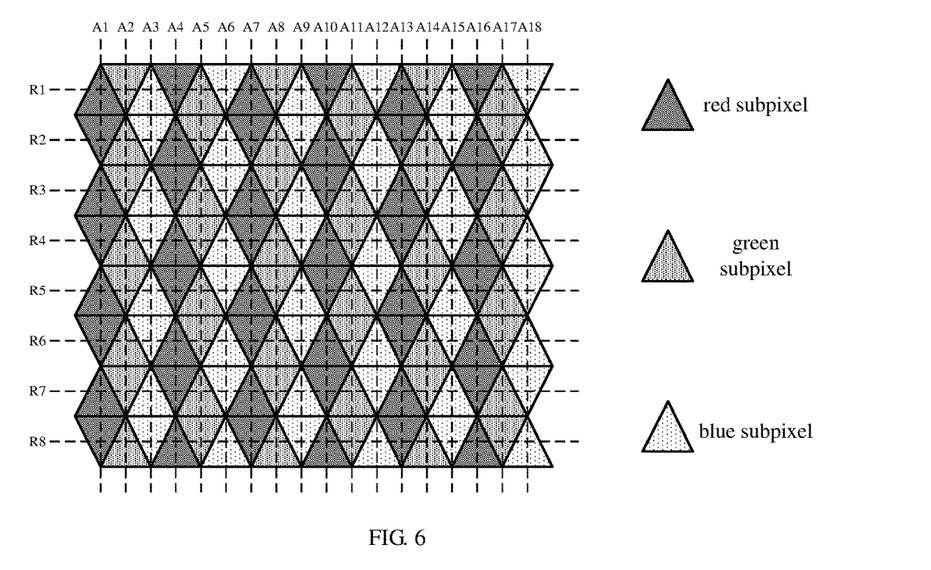
FIG. 6 shows a schematic view of subpixel coordinates according to an embodiment of the present invention.

According to an exemplary embodiment of the present invention, as shown in FIG. 6, each of the red subpixel, the green subpixel and the blue subpixel takes the midpoint of the perpendicular line from its vertex to its base as its coordinate point. For example, the coordinates $(R_1, A_1)$ of the red subpixel in the initial first pixel of the first line corresponds to the midpoint of the perpendicular line from its vertex to its base. The midpoint of the perpendicular line from the vertex of the isosceles triangle to its base may split the isosceles triangle in width (i.e., horizontally) and height (i.e., vertically) and is helpful in setting coordinates for each subpixel in the pixel structure.

According to an exemplary embodiment of the present invention, the red subpixel in the first pixel has the same y-ordinate as the inverted red subpixel in the inverted first pixel; the inverted green subpixel in the first pixel has the same y-ordinate as the green subpixel in the inverted first pixel; the blue subpixel in the second pixel has the same y-ordinate as the inverted blue subpixel in the inverted second pixel; the inverted red subpixel in the second pixel has the same y-ordinate as the red subpixel in the inverted second pixel; and the green subpixel in the third pixel has the same y-ordinate as the inverted green subpixel in the inverted third pixel; the inverted blue subpixel in the third pixel has the same y-ordinate as the blue subpixel in the inverted third pixel.

According to an exemplary embodiment of the present invention, by arranging the erected subpixels and the inverted subpixels correspondingly, it may be ensured that vertical lines and slashes are displayed well.

Figure 7:
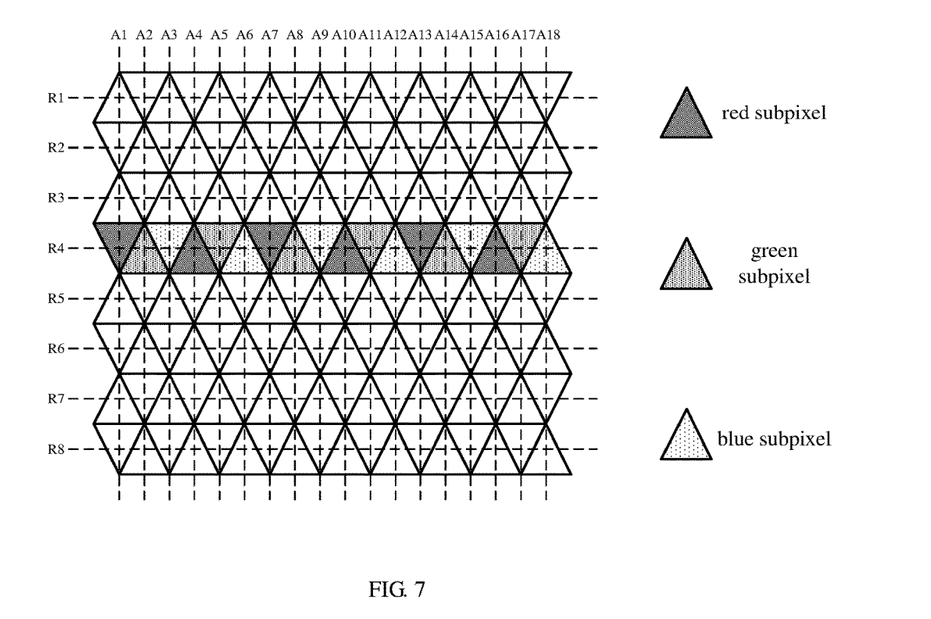
FIG. 7 shows a schematic view of displaying a white horizontal line according to an embodiment of the present invention.

When the pixel structure according to an exemplary embodiment of the present invention displays horizontal white lines, as shown in FIG. 7, it may drive all subpixels in a line with the abscissa as $R_4$, i.e., may drive all red subpixels, green subpixels and blue subpixels with the abscissa as $R_4$.

Figure 8:
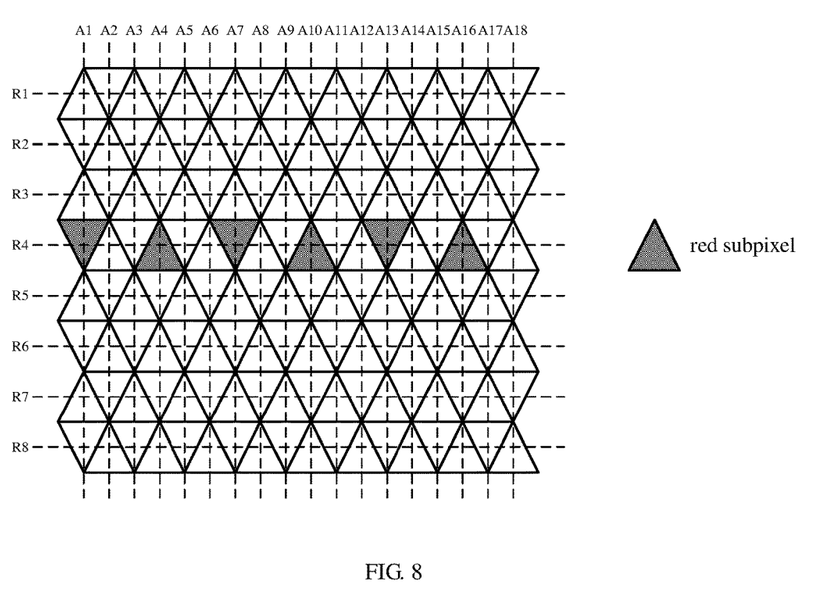
FIG. 8 shows a schematic view of displaying a red horizontal line according to an embodiment of the present invention.

When the pixel structure according to an exemplary embodiment of the present invention displays horizontal red lines, as shown in FIG. 8, it may drive all red subpixels with the abscissa as $R_4$. Accordingly, similarly for the way to display horizontal green lines and horizontal blue lines, it is only necessary to drive subpixels of the corresponding colors in the corresponding lines and this will not be repeated herein.

Figure 9:
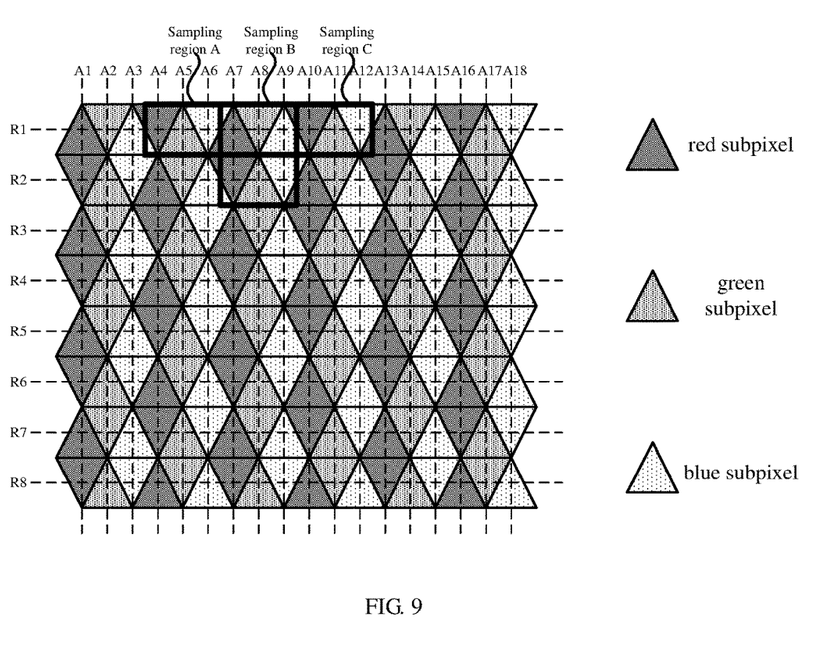
FIG. 9 shows a schematic view of a sampling region according to an embodiment of the present invention.

As shown in FIG. 9, the pixel structure according to an exemplary embodiment of the present invention further comprises a plurality of sampling regions, wherein the centers of sampling regions A, B and C coincide with coordinate points of the green subpixels; accordingly, centers of other sampling regions may also coincide with coordinate points of the red subpixels, green subpixels or blue subpixels.

According to an exemplary embodiment of the present invention, it may be ensured that the display color of subpixels corresponding to the sampling region may be completely collected by the sampling region. In fact the entire pixel structure is provided with closely arranged sampling regions, but not all are shown in the figure, and this will not be repeated herein.

According to an exemplary embodiment of the present invention, the sampling region may be a rectangle, the width of the rectangle is equal to the height of the red subpixel (i.e., the distance between the vertex of the isosceles triangle corresponding to the red subpixel and the midpoint of its base), and the length of the rectangle is equal to 1.5 times the length of the base of the red subpixel.

As shown in FIG. 9, in addition to completely collecting the green subpixel of the center position $(R_1, A_5)$, the sampling area A may also collect the majority of the inverted red subpixels corresponding to $(R_1, A_4)$ and the majority of the inverted blue subpixels inverted corresponding to $(R_1, A_6)$, and may also collect the minority of the blue subpixels corresponding to $(R_1, A_3)$ and the minority of the red subpixels corresponding to $(R_1, A_7)$. The sum of areas of the majority of the inverted red subpixels corresponding to $(R_1, A_4)$ and the minority of the red subpixels corresponding to $(R_1, A_7)$ is equal to the area of one complete red subpixel, and the sum of areas of the majority of the inverted blue subpixels corresponding to $(R_1, A_6)$ and the minority of the blue subpixels corresponding to $(R_1, A_3)$ is equal to the area of one complete blue subpixel. Sampling region B and sampling region C are similar to the sampling of sampling region A, and are not discussed herein.

With the sampling regions provided in an exemplary embodiment of the present invention, the pixel structure may be completely divided for complete sampling of the pixel structure. And the red subpixels, green subpixels and blue subpixels in each sampling area have equal corresponding area, ensuring that the sampling regions can collect the subpixels on both sides of the center subpixel, so that by driving with subpixel rendering, luminance reallocation may be done conveniently.

According to a particular embodiment, the isosceles triangle corresponding to the subpixel may be an equilateral triangle.

The pixel structure according to an exemplary embodiment of the present invention further comprises a drive unit, which determines, upon receiving a white point display command, the coordinates of the white point to be displayed, drives the red subpixel, green subpixel and blue subpixel with the determined coordinates as vertices, or drives the inverted red subpixel, inverted green subpixel and inverted blue subpixel with the determined coordinates as vertices.

Figure 10:
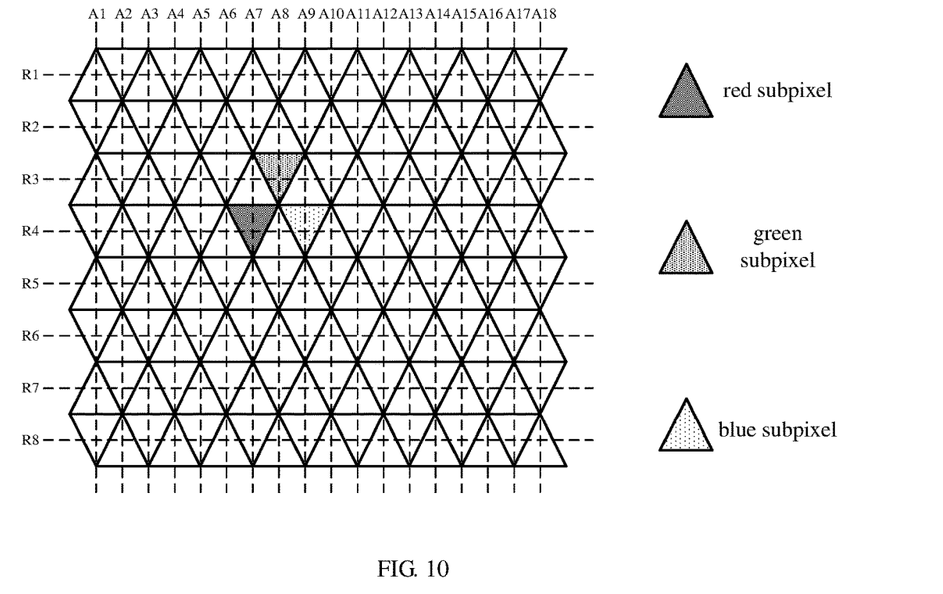
FIG. 10 shows a schematic view of displaying a white point according to an embodiment of the present invention.

As shown in FIG. 10, upon receiving the white point display command, the drive unit determines the coordinates of the displayed white point, e.g., its coordinates are ($R_{3.5}$, $A_8$), then drives the inverted red subpixel, inverted green subpixel and inverted blue subpixel with ($R_{3.5}$, $A_8$) as the vertex thereof, specifically, may drive the inverted green subpixel corresponding to ($R_3$, $A_8$), the inverted red subpixel corresponding to ($R_4$, $A_7$), and the inverted blue subpixel corresponding to ($R_4$, $A_9$). Three subpixels are collected from different pixels or inverted pixels, thereby achieving a more flexible driving.

Figure 11:
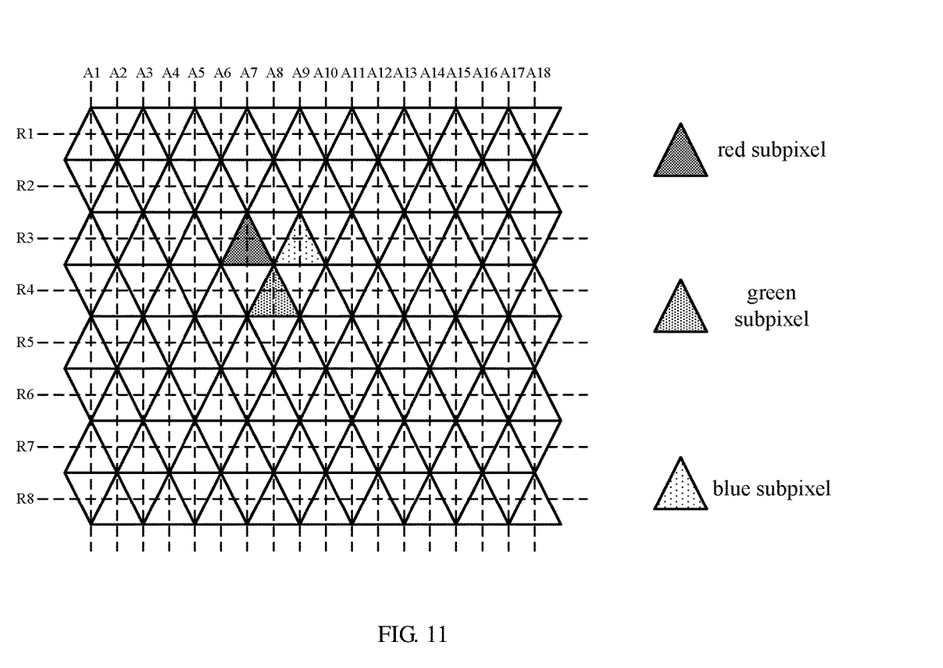
FIG. 11 shows a schematic view of displaying a white point according to another embodiment of the present invention.

As shown in FIG. 11, in addition to driving white point with coordinates corresponding to ($R_{3.5}$, $A_8$) in a driving manner shown in FIG. 10, it is also possible to drive the blue subpixel corresponding to ($R_3$, $A_9$), the red subpixel corresponding to ($R_3$, $A_7$) and the green subpixel corresponding to ($R_4$, $A_8$), thereby displaying the white point corresponding to the coordinates ($R_{3.5}$, $A_8$). According to an exemplary embodiment of the present invention, it is achieved to display one white point in a variety of ways, while when displaying the white point in the existing pixel structure, it is required to drive three subpixels in one pixel, but the present disclosure can drive subpixels of three pixels in two ways, thereby achieving a more flexible driving.

According to an exemplary embodiment of the present invention, upon receiving a monochrome vertical line display command, the drive unit drives subpixels and/or inverted subpixels of target color and with a target y-ordinate.

Figure 12:
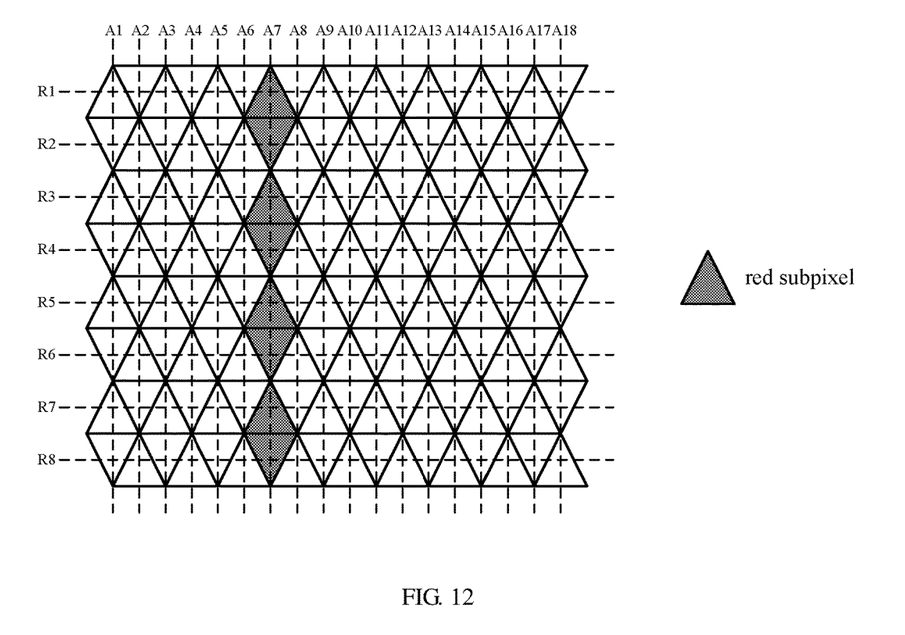
FIG. 12 shows a schematic view of displaying a red vertical line according to an embodiment of the present invention.
Figure 13:
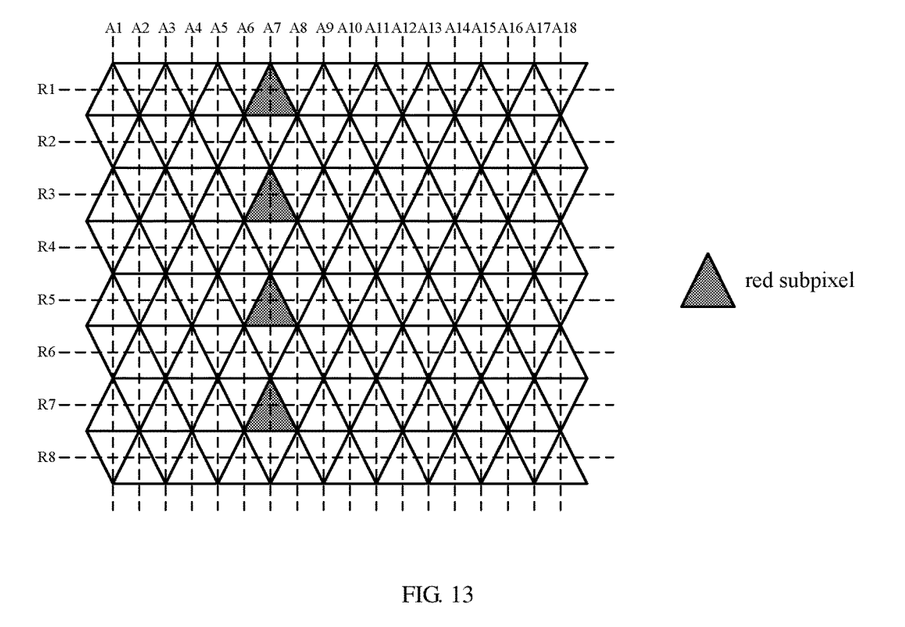
FIG. 13 shows a schematic view of displaying a red vertical line according to another embodiment of the present invention.

As shown in FIG. 12, upon receiving the monochrome vertical line display command, e.g., as determining that the target y-ordinate is $A_7$, the drive unit may drive all of the red subpixels and red inverted subpixels in the column, and the color of the monochrome vertical line displayed in this display manner is darker. For a lighter color of the monochrome vertical line, as shown in FIG. 13, it may also drive only part of subpixels in the $A_7$ column, for example, only drive inverted red subpixels or only drive red subpixels, and under this display manner only a half of subpixels in one column need to be driven. Under the premise of a normal display, power consumption may be reduced.

Figure 14:
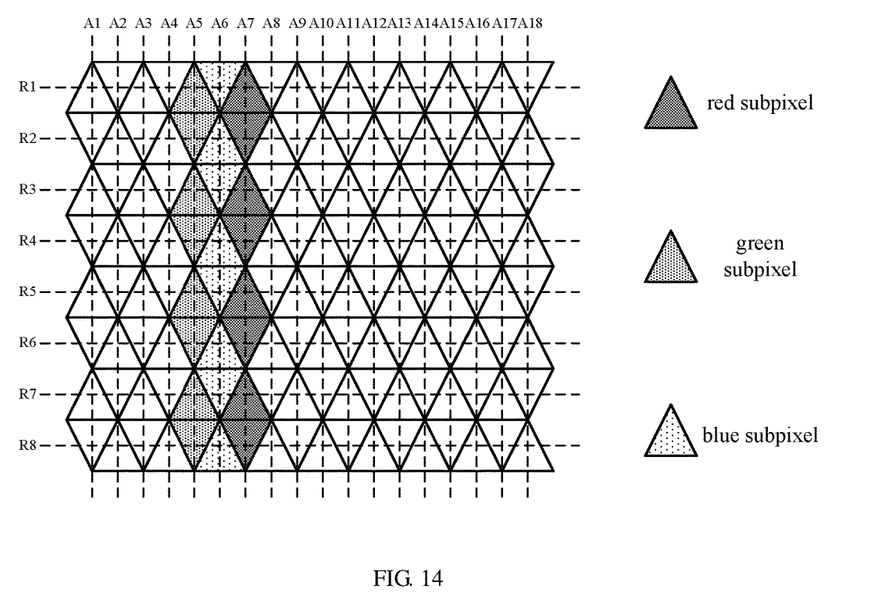
FIG. 14 shows a schematic view of displaying a white vertical line according to an embodiment of the present invention.

According to an exemplary embodiment of the present invention, as shown in FIG. 14, upon receiving a white vertical line display command, for example determining that the target ordinate is $A_6$, the drive unit may drive all the blue subpixels corresponding to column $A_6$, all the green subpixels in column $A_5$ and all the red subpixels in column $A_7$.

According to an exemplary embodiment of the present invention, upon receiving a slash display command, the drive unit drives, when determining that coordinates of two starting subpixels of the slash to be displayed are ($R_m$, $A_n$), ($R_m$, $A_{n+1}$) and coordinates of two end subpixels are ($R_{m+k}$, $A_{n+k}$), ($R_{m+k}$, $A_{n+k+1}$), subpixels with one or more colors and coordinates as ($R_{m+x}$, $A_{n+x}$), ($R_{m+x}$, $A_{n+x+1}$), wherein x is an integer greater than or equal to 0 and less than or equal to k, and m, n and k are positive integers.

Figure 15:
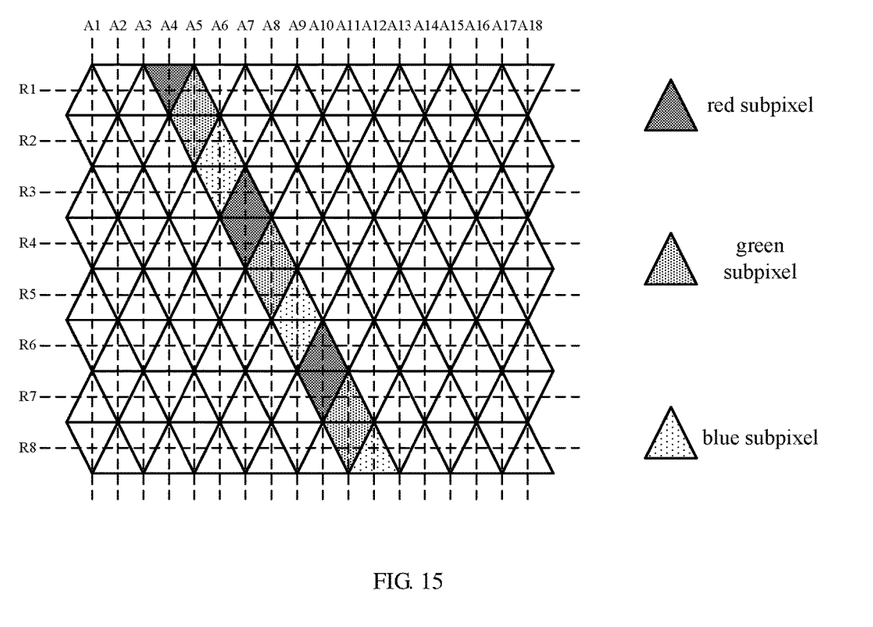
FIG. 15 shows a schematic view of displaying a white slash according to an embodiment of the present invention.
Figure 16:
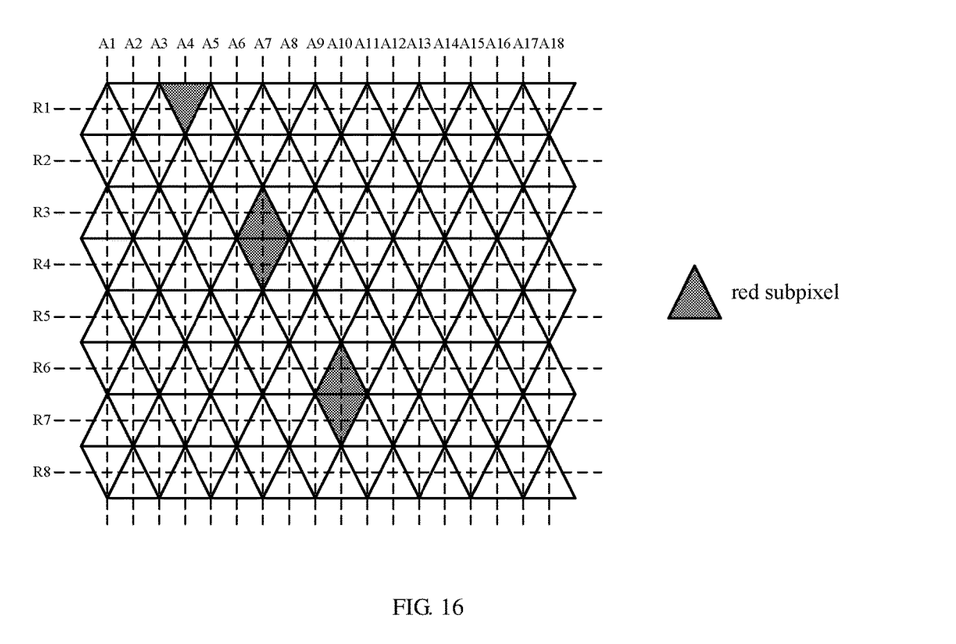
FIG. 16 shows a schematic view of displaying a red slash according to an embodiment of the present invention.

Since a subpixel is triangular, as shown in FIG. 15, when displaying a white slash, the coordinates of the starting subpixel are ($R_1$, $A_4$), ($R_1$, $A_5$), and the coordinates of two end subpixels are ($R_8$, $A_{11}$), ($R_8$, $A_{12}$), wherein subpixels ($R_{1+x}$, $A_{5+x}$) and ($R_{1+x}$, $A_{5+x+1}$) have a corresponding hypotenuse, while ($R_{1+x}$, $A_{3+x}$) and ($R_{1+x}$, $A_{3+x+1}$) (x is an integer greater than or equal to 0 and less than or equal to 7) have a corresponding hypotenuse, so that the formed slate has smooth sides, and compared with the slash formed by rectangular subpixels in the prior art, the formed slate has no jagged teeth on both sides, with better display effect. Accordingly, if a monochrome slash needs to be displayed, such as the red line shown in FIG. 16, it is possible to drive red subpixels or inverted red subpixels with the coordinates ($R_1$, $A_4$), ($R_3$, $A_7$), ($R_4$, $A_7$), ($R_6$, $A_{10}$) and ($R_7$, $A_{10}$).

Figure 17:
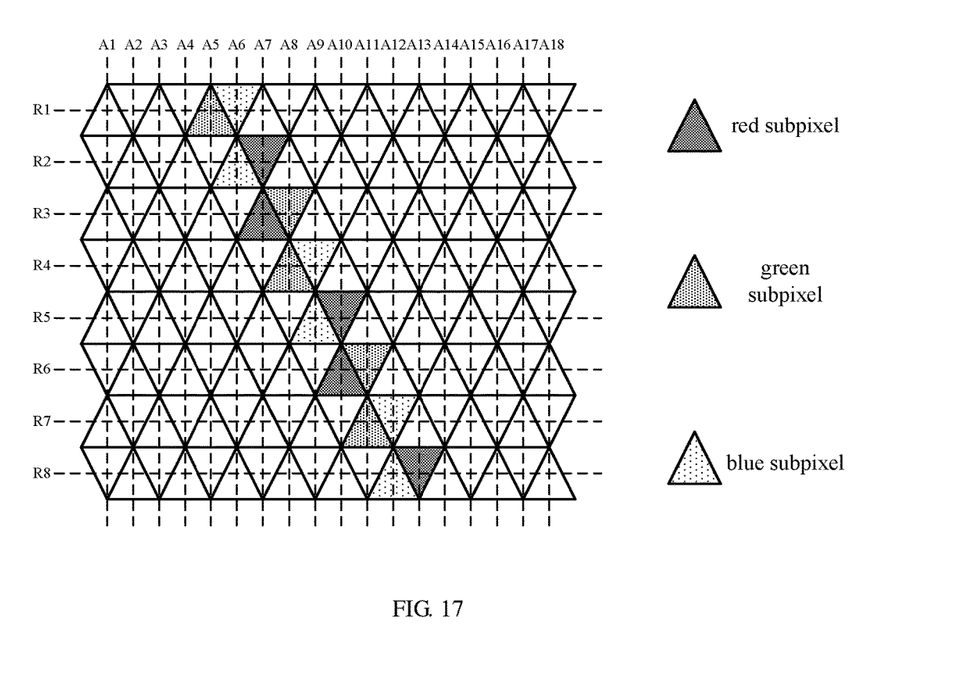
FIG. 17 shows a schematic view of displaying a white slash according to another embodiment of the present invention.

According to an exemplary embodiment of the present invention, the slash display manner shown in FIG. 17 may also be employed, i.e., to drive subpixels or inverted subpixels with the coordinates corresponding to ($R_{1+k}$, $A_{5+k}$), ($R_{1+k}$, $A_{5+k+1}$) (x is an integer greater than or equal to 0 and less than or equal to 7), and at the time, since there is still a slash with both smooth sides in the overall display effect, the overall display effect is still improved.

According to an exemplary embodiment of the present invention, upon receiving a display command, the drive unit determines an area to be displayed and subpixels to be displayed, may allocate the luminance of a % to the subpixels to be displayed in the area to be displayed, and allocate the luminance of 0.5a % to subpixels having the same color as the subpixels to be displayed in an area adjacent to the area to be displayed, where a is a positive number.

Figure 18:
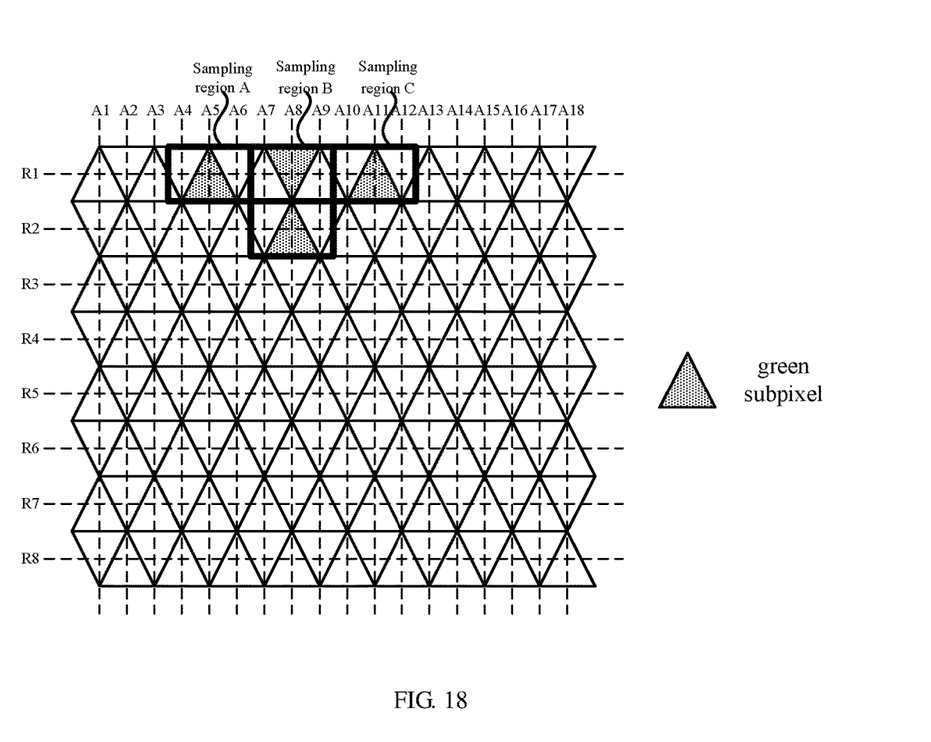
FIG. 18 shows a schematic view of luminance allocation according to another embodiment of the present invention.

As shown in FIG. 18, for example, if the determined area to be displayed is inverted green subpixels corresponding to ($R_1$, $A_8$), then when collecting the subpixel luminance therein by the sampling region B, the luminance of 100% may be allocated to the inverted green subpixel corresponding to ($R_1$, $A_8$). For the sampling region A and sampling region C which are regions adjacent to the sampling region B, the luminance of 50% is allocated to the green subpixel corresponding to ($R_1$, $A_5$) in the sampling region A, and the luminance of 50% is allocated to the green subpixel corresponding to ($R_1$, $A_{11}$) in the sampling region C (accordingly, the corresponding luminance allocation may also be performed on the green subpixels in the sampling region below the sampling region B).

According to an exemplary embodiment of the present invention, materials of the red subpixel, green subpixel and blue subpixel include but are not limited to organic light emitting material.

According to an exemplary embodiment of the present invention, there is further provided a display substrate comprising the pixel structure.

According to an exemplary embodiment of the present invention, there is further provided a display device comprising the display substrate.

It would be appreciated that the display device according to this embodiment may be any product or component with display function, such as an electronic paper, a mobile phone, a tablet, a TV, a laptop, a digital frame, a navigator, etc.

Exemplary embodiments of the present invention have been described in detail in combination with the drawings hereinabove. Taking into account the relevant art in which it is required to closely arrange organic light emitting materials in the production of subpixels with conventional ways of arrangement, in the production of an OLED display substrate with higher visual resolution, small high-density integration is required for production of each light emitting material, thereby resulting in difficult processes and high cost. According to the exemplary embodiments of the present invention, a pixel may be formed by two subpixels with a triangle shape, the subpixels therein are driven by subpixel rendering, and a small number of actual physical pixel spatial positions are used to represent more image signals, thereby improving the actual output image quality.

The above is only specific embodiments of the present invention, but the scope of protection of the present invention is not limited thereto, and any person skilled in the art can easily conceive of modifications or equivalents within the technical scope of the present invention disclosed, which should fall within the scope of protection of the present invention. Accordingly, the scope of protection of the present invention should be based on the scope of protection of the claims attached.

What is claimed is:

1. A pixel structure, comprising:
a plurality of first pixels and inverted first pixels;
a plurality of second pixels and inverted second pixels; and
a plurality of third pixels and inverted third pixels, wherein:
in a first line of pixels of two adjacent lines of pixels, at least one of the first pixels, at least one of the second pixels and at least one of the third pixels are arranged horizontally in a circular manner, and in a second line of the two adjacent lines of pixels, at least one of the inverted first pixels, at least one of the inverted second pixels and at least one of the inverted third pixels are arranged horizontally in a circular manner;
the first pixel comprises a first subpixel and an inverted second subpixel, the second pixel comprises a third subpixel and an inverted first subpixel, and the third pixel comprises a second subpixel and an inverted third subpixel;
the first subpixel, the second subpixel, and the third subpixel are different from each other, and are selected from red subpixels, green subpixels, and blue subpixels, respectively;
a sequential order of the red subpixels, the green subpixels and the blue subpixels in the first line is the same as a sequential order of the red subpixels, the green subpixels and the blue subpixels in the second line, and abscissas of subpixels in a same line are equal;
the red subpixels, the green subpixels and the blue subpixels are each in the shape of a congruent isosceles triangle;
the first subpixel in the first pixel has the same y-ordinate as the inverted first subpixel in the inverted first pixel;
the inverted second subpixel in the first pixel has the same y-ordinate as the second subpixel in the inverted first pixel;
the third subpixel in the second pixel has the same y-ordinate as the inverted third subpixel in the inverted second pixel;
the inverted first subpixel in the second pixel has the same y-ordinate as the first subpixel in the inverted second pixel;
the second subpixel in the third pixel has the same y-ordinate as the inverted second subpixel in the inverted third pixel; and
the inverted third subpixel in the third pixel has the same y-ordinate as the third subpixel in the inverted third pixel.

2. The pixel structure according to claim 1, wherein each of the first subpixel, the second subpixel and the third subpixel takes a midpoint of a perpendicular line from its vertex to its base as its coordinate point.

3. The pixel structure according to claim 1, further comprising:
a plurality of sampling regions,
wherein a center of each of the sampling regions coincides with the coordinate point of the first subpixel, or the second subpixel, or the third subpixel.

4. The pixel structure according to claim 3, wherein the sampling region has a rectangle shape, a width of the rectangle is equal to a height of the first subpixel, and a length of the rectangle is equal to 1.5 times a length of a base of the first subpixel.

5. The pixel structure according to claim 1, wherein the isosceles triangle is an equilateral triangle.

6. The pixel structure according to claim 1, further comprising:
a drive unit configured to determine, upon receiving a white point display command, coordinates of the white point to be displayed, and to:
drive the first subpixel, the second subpixel and third subpixel with the determined coordinates as vertices; or
drive the inverted first subpixel, the inverted second subpixel and the inverted third subpixel with the determined coordinates as vertices.

7. The pixel structure according to claim 6, wherein upon receiving a monochrome vertical line display command, the drive unit drives target color subpixels and/or inverted target color subpixels with a target y-ordinate.

8. The pixel structure according to claim 6, wherein upon receiving a slash display command, the drive unit determines that coordinates of two starting subpixels of the slash to be displayed are $(R_m, A_n)$, $(R_m, A_{n+1})$ and coordinates of two end subpixels of the slash are $(R_{m+k}, A_{n+k})$, $(R_{m+k}, A_{n+k+1})$, and drives subpixels with one or more colors and coordinates $(R_{m+x}, A_{n+x})$, $(R_{m+x}, A_{n+x+1})$, where x is an integer greater than or equal to 0 and less than or equal to k, and m, n and k are positive integers.

9. The pixel structure according to claim 6, wherein, upon receiving a display command, the drive unit determines an area to be displayed and subpixels to be displayed, allocates a luminance of a % to the subpixels to be displayed in the area to be displayed, and allocates a luminance of 0.5a % to subpixels having the same color as the subpixels to be displayed in an area adjacent to the area to be displayed, where a is a positive number.

10. The pixel structure according to claim 1, wherein the first subpixel, the second subpixel and the third subpixel each include organic light emitting material.

11. The pixel structure according to claim 1, wherein the first subpixels are red subpixels, the second subpixels are green subpixels, and the third subpixels are blue subpixels.

12. A display substrate comprising the pixel structure according to claim 1.

13. A display device comprising the display substrate according to claim 12.

* * * * *